(12) United States Patent
Zhang

(10) Patent No.: US 10,530,377 B1
(45) Date of Patent: Jan. 7, 2020

(54) AREA EFFICIENT CURRENT DAC

(71) Applicant: NXP B.V., Eindhoven (NL)

(72) Inventor: Xu Zhang, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/157,996

(22) Filed: Oct. 11, 2018

(51) Int. Cl.
*H03M 1/06* (2006.01)

(52) U.S. Cl.
CPC .................. *H03M 1/0607* (2013.01)

(58) Field of Classification Search
CPC ........ H03M 1/745; H03M 1/747; H03M 1/46; H03M 1/687; H03M 1/742; H03M 1/0607; H03M 1/0612; H03M 1/10; H03M 1/1023; H03M 1/1057
USPC .......... 341/118–121, 144, 145, 153
See application file for complete search history.

(56) References Cited

U.S. PATENT DOCUMENTS

| | | | | |
|---|---|---|---|---|
| 4,551,705 A | * | 11/1985 | Anderson | H03M 1/74 257/390 |
| 5,838,271 A | * | 11/1998 | Park | H03M 1/682 341/144 |
| 6,621,439 B1 | * | 9/2003 | Bugeja | H03M 1/0863 341/144 |
| 6,738,006 B1 | * | 5/2004 | Mercer | H03M 1/0604 341/144 |
| 6,927,719 B1 | * | 8/2005 | Siniscalchi | H03M 1/0604 341/144 |
| 7,049,986 B1 | * | 5/2006 | Jones | G11C 7/06 341/121 |
| 7,076,384 B1 | * | 7/2006 | Radulov | H03M 1/1057 324/601 |
| 7,646,235 B2 | * | 1/2010 | Christ | H03M 1/682 327/543 |
| 7,764,211 B2 | * | 7/2010 | Tokumaru | H03M 1/002 341/144 |
| 8,094,055 B2 | * | 1/2012 | Gaknoki | H03M 1/68 341/118 |
| 9,991,900 B1 | * | 6/2018 | Kabir | H03M 1/067 |
| 2009/0045993 A1 | * | 2/2009 | Tokumaru | H03M 1/002 341/136 |

OTHER PUBLICATIONS

D. H. Lee, et al., "Low-Cost 14-Bit Current-Steering DAC With a Randomized Thermometer-Coding Method," IEEE Transactions on Circuits and Systems-II: Express Briefs, vol. 56, No. 2, pp. 137-141. (2009).

J. Borg, et al., "An Ultrasonic Transducer Interlace IC With Integrated Push-Pull 40 Vpp, 400 mA Current Output, 8-bit DAC and Integrated HV Multiplexer," IEEE Journal of Solid-State Circuits, vol. 46, No. 2, pp. 475-483. (2011).

* cited by examiner

*Primary Examiner* — Linh V Nguyen

(57) ABSTRACT

A current digital to analog converter (DAC) including an offset array including a plurality of unit cells of a first size, and a trimming array including a plurality of unit cells having the first size and a plurality of half cells, wherein the half cells have a larger size than the plurality of unit cells.

18 Claims, 4 Drawing Sheets

AREA EFFICIENT CURRENT DAC

TECHNICAL FIELD

Various exemplary embodiments disclosed herein relate to digital-to-analog converters, and more particularly to an area efficient current digital-to-analog converter.

SUMMARY

A brief summary of various embodiments is presented below. Some simplifications and omissions may be made in the following summary, which is intended to highlight and introduce some aspects of the various embodiments, but not to limit the scope of the invention. Detailed descriptions of embodiments adequate to allow those of ordinary skill in the art to make and use the inventive concepts will follow in later sections.

Embodiments include a current digital to analog converter (DAC) including an offset array including a plurality of unit cells of a first size, and a trimming array including a plurality of unit cells having the first size and a plurality of half cells, wherein the half cells have a larger size than the first sizes of plurality of unit cells.

A half cell may handle substantially half of a current amount as a unit cell.

The offset array may be configured to generate an offset current of the DAC converter.

The trimming array may be configured to vary the current output depending on digital controls and/or to cancel manufacturing process variations of the DAC converter.

A row of the trimming array may include three unit cells and two half cells.

The offset array may include twenty-four unit cells.

The trimming array may include sixteen half cells and twenty-four unit cells.

A unit cell may include a current generation transistor, a row select transistor and a column select transistor.

A half cell may include two current generation transistors connected in series, a row select transistor and a column select transistor.

Embodiments may also include a method of performing digital to analog conversion (DAC) of a digital data stream, including generating a plurality of first currents using respective unit cells having a first size in a trimming cell array, selecting at least one unit cell to decode a first bit of the received digital data stream, generating a plurality of second currents using respective half cells of the trimming cell array, wherein the second currents are less than the first currents, and selecting at least one half cell to decode a second bit of the received digital data stream.

The unit cells and half cells may be selected using row and column selections.

The method may include providing an offset array including a plurality of unit cells having the first size, and wherein the half cells have a larger size than the first sizes of the pluralities of unit cells.

The trimming array may be configured to vary the current output depending on digital controls or to cancel manufacturing process variations of the DAC converter.

BRIEF DESCRIPTION OF THE DRAWINGS

Additional objects and features of the invention will be more readily apparent from the following detailed description and appended claims when taken in conjunction with the drawings. Although several embodiments are illustrated and described, like reference numerals identify like parts in each of the figures, in which:

DETAILED DESCRIPTION

Figure 1:
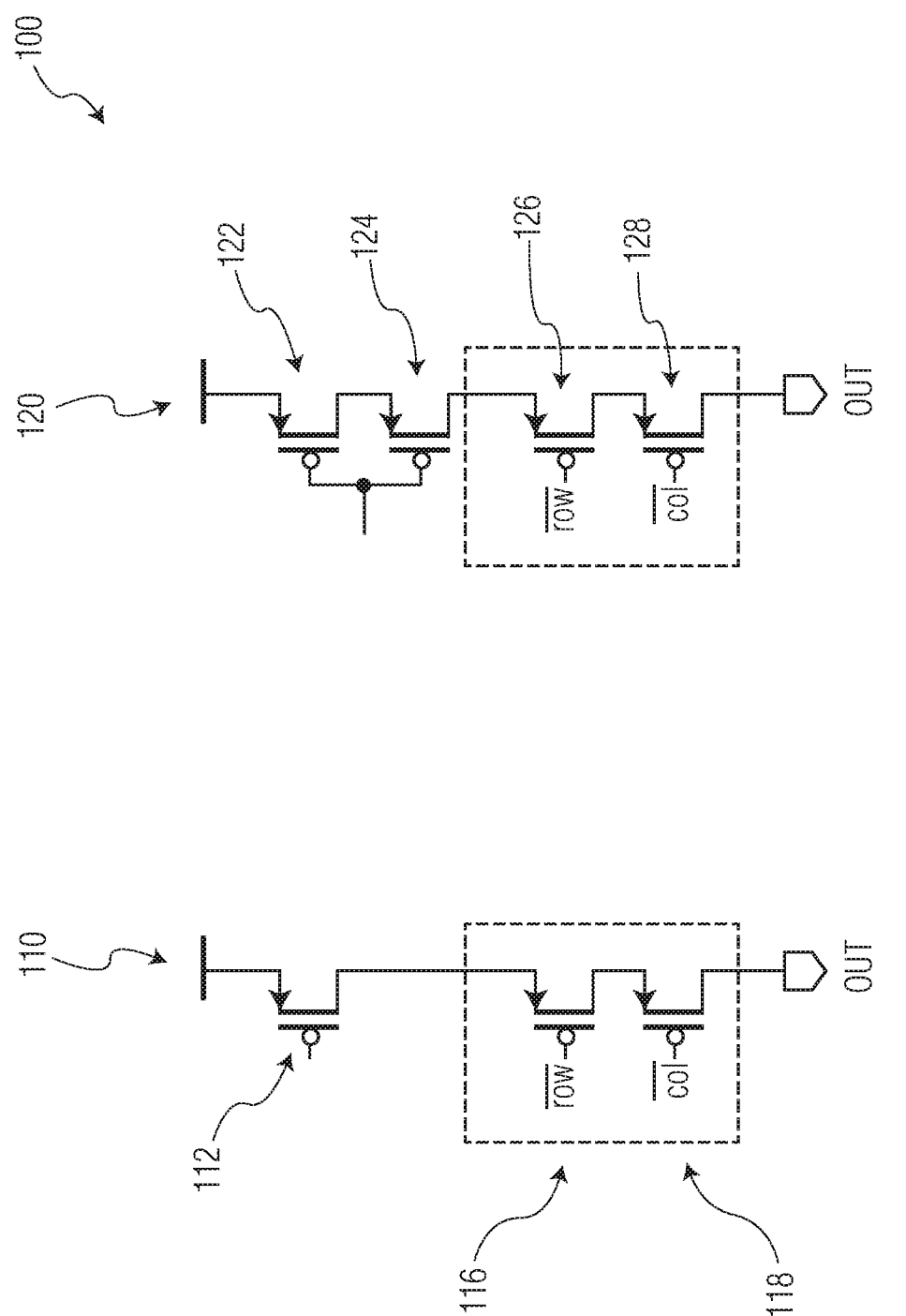
FIG. 1 illustrates a unit cell and half cell in accordance with embodiments described herein.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or illustrated herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Current digital to analog conversion using a current digital-to-analog converter (DAC) is used in analog-to-digital or digital-to-analog systems, such as audio, image processing systems. The conversion is, in addition, widely applied in blocks with current trimming/selection capabilities, e.g. oscillator, delay cell and voltage/current reference. A digital to analog converter is typically thermometer coded instead of binary coded to ensure monotonicity in the design. Thermometer coded current DACs are typically configured in an array form which includes many unit cells and may consume a considerable amount of real estate in the chip floor plan to guarantee accuracy.

Embodiments described herein include a current DAC with a smaller layout area compared to other thermometer coded DACs. DACs described herein have very small accuracy degradation.

A current DAC according to embodiments described herein may include two types of cells, a unit cell and a half cell. The half cell may have two unit-MOS transistors in serial. Use of the two devices does not degrade an accuracy of the half cell due to unit device mismatch. The current DAC described herein is in a form of column and row array. Each row of the array may include less unit devices if the row is selected by greater or equal to three bits. In addition, a current DAC described herein may use half a number of cells to generate an offset current as a result of reference scaling. Embodiments apply to trimmable oscillators, slew rate and delay control, voltage and current references, or any applications with a current DAC. A plurality of current DAC cells may control, to different resolutions, contributions to a total offset current thereby allowing a total circuit current to be precisely controlled. Offset current may be controlled by selecting and/or deselecting various cells in the offset array.

FIG. 1 illustrates a unit cell 110 and half cell 120 of a current source device 100 in accordance with embodiments described herein. The unit cell 110 includes a current generation transistor 112, a row selector switch 116, and a column selector switch 118. Current is generated from the current generation transistor 112 depending on the biasing conditions. The row selector switch 116 and the column selector switch 118 may be used for cell selection in an array. An output voltage from the unit cell 110 may result from a current drawn through the cell transistors 112, 116, and 118 due to a resistance associated therewith. The cell transistors 112, 116, and 118 may be PMOS or NMOS transistors.

The half cell 120 differs from the unit cell 110 in that the half cell 120 may include two current generation transistors 122 and 124 arranged in series. The two current generation transistors 122 and 124 may double a equivalent length (L) through the half cell 120 as compared to the single transistor 112 of the unit cell 110. Thus the half cell 120 may be configured to draw substantially half an amount of current as a unit cell 115 (illustrated in FIG. 3), while the size of the half cell 120 may be substantially twice the size of a unit cell. The half cell 120 includes a row selector switch 126 and a column selector switch 128. The row selector switch 126 and the column selector switch 128 may be used for cell selection in an array. An output voltage from the half cell 120 may represent a current through the cell transistors 122, 124, 126, and 128 multiplied by the resistance of the cell transistors. The cell transistors 122, 124, 126, and 128 may be PMOS or NMOS transistors. The unit cell 110 and half cell 120 may be connected to cascode devices (not illustrated).

To minimize the size of a DAC array that uses only unit cells 110, half cells 120 may be used in combination with unit cells 110. As noted, half cells 120 may consume up to substantially twice the area compared to a unit cell 100, but use substantially half the current. This circumstance holds when the current source device 100 has a large length, such as in a current mirror/source design. The row 126 and column 128 switches are small and the routing area is negligible.

Figure 2:
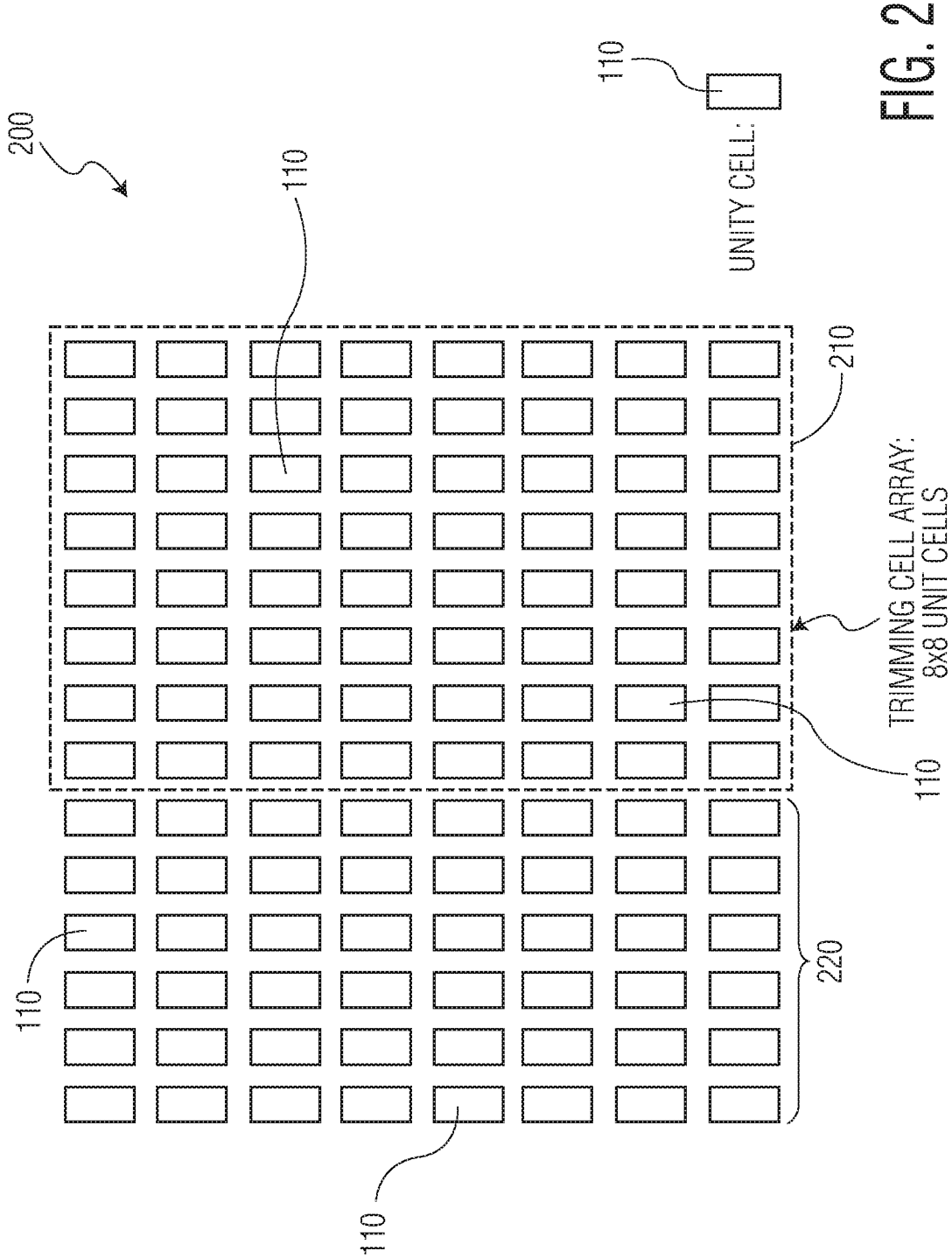
FIG. 2 illustrates a thermometer coded 6-bit (8×8 array) current DAC with 48-unit offset in accordance with embodiments described herein.

FIG. 2 illustrates a traditional thermometer coded current DAC 200 having a 6-bit design 210 (8×8 trimming cell array) with a 48-unit offset array 220 in accordance with embodiments described herein. The offset array 220 may be for data converters that translate digital information to an analog domain with non-zero average. The offset array 220 may be used in design practice for current and voltage references, slew rate and delay control or oscillator biasing, which uses trimming/programmability around a certain value without having too many control bits to cover a large dynamic range. The trimming cell array 210 may be used to vary the current output depending on the digital controls or to cancel manufacturing process variations by activating selected cells and not activating others. As illustrated in FIG. 2, all of the cells 110 used in the 8×8 array 210 and the in the offset array 220 are unit cells 110. There are 112 total unit cells 110.

Figure 3:
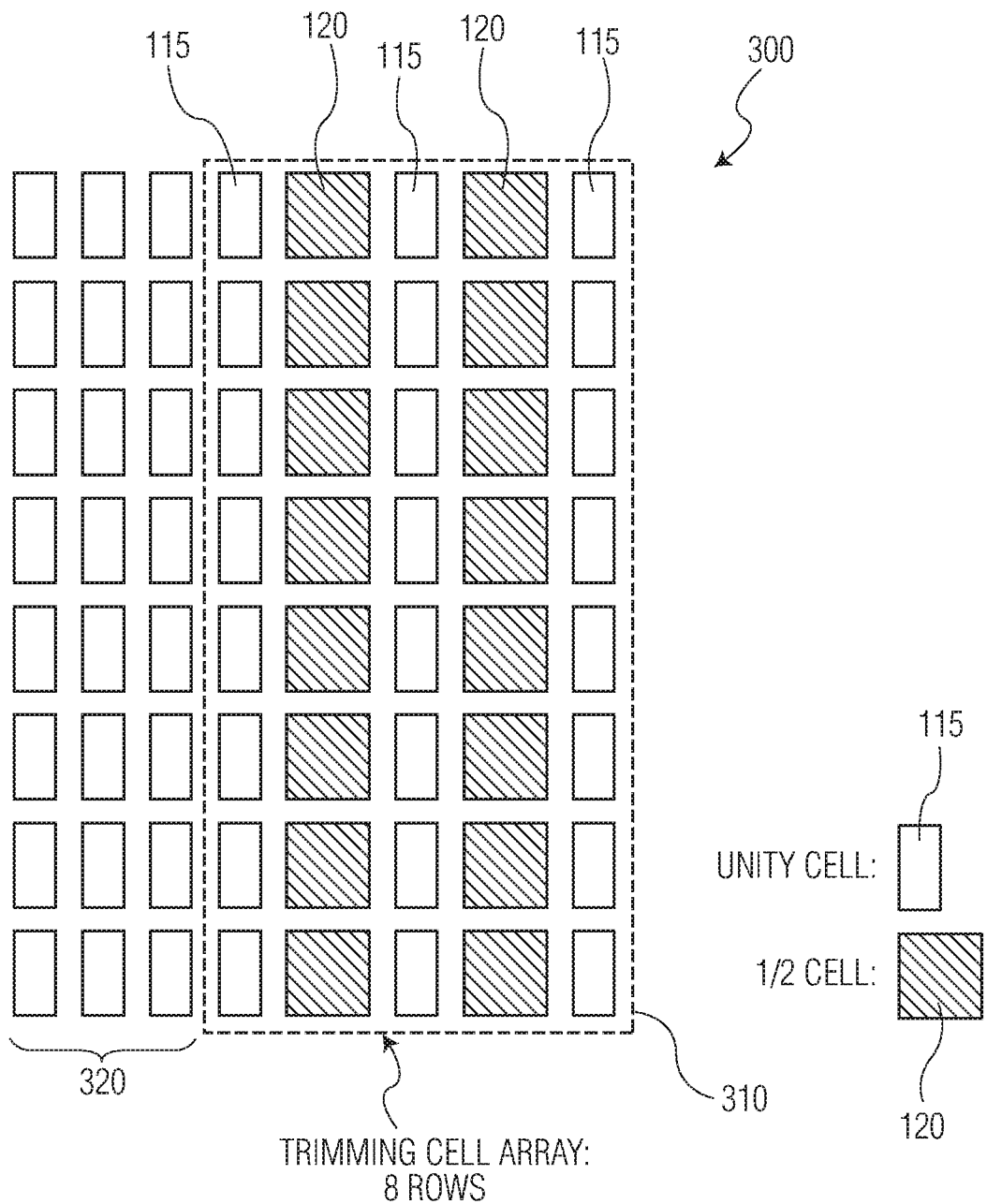
FIG. 3 illustrates a design variation for the DAC of FIG. 2 in accordance with embodiments described herein.

FIG. 3 illustrates a current DAC 300 having unit cells 115 and half cells 120 in accordance with embodiments described herein. The current DAC may have a 6×8 trimming cell array 310 that includes half cells 120 and unit cells 115 and takes up less space than an array with only unit cells. The current DAC 300 may include an offset array 320 of 3 column by 8 row size. Different rows of the trimming cell array 310 may have only three unit cells 115 and two half cells 120. In the trimming cell array 310, the unit cells 115 in combination with half cells 120 may minimize a length (L) of current generation transistors 112, 122, 124 in a trimming cell array 310 by V as compared to the trimming cell array 210. The trimming cell array 310 may have a same accuracy as the larger trimming cell array 210 and may increase the width (W) of current generation transistors 112, 122, 124 by $\sqrt{2}$ to have a same over-drive voltage. Both trimming cell arrays 210 and 310 may use the same size unit cells 110 and 115, though with different W/L ratios, while the half cell 120 may have substantially twice the area. As illustrated in FIGS. 2 and 3, the current DAC 200 is about 40% larger than the DAC 300.

According to embodiments described herein, each unit cell 115 may carry twice an amount of current compared to a unit cell 110 in the design of FIG. 2 to maintain a same LSB (Least Significant Bit) resolution. The embodiment illustrated in FIG. 3 maintains the same LSB resolution accuracy in light of device mismatches even with reduced area.

Figure 4:
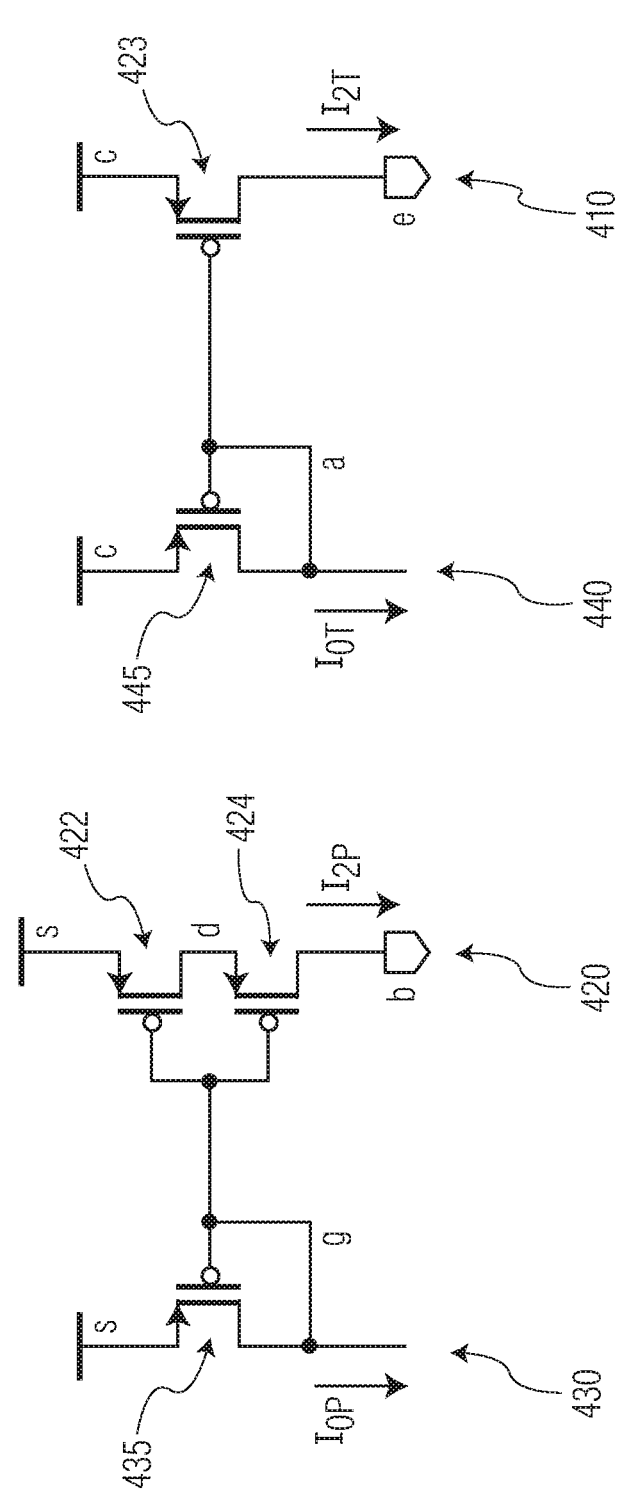
FIG. 4 illustrates a half cell and unit cell with reference biasing device in accordance with embodiments described herein.

The area calculation described above uses WL as an estimate for unit cell 110 and 115 areas. It may be accurate when the current source devices 100 have a large L (common for current mirror/source design), in that the row 126 and column 128 switches are small and the routing area is negligible. The area reduction is less when L decreases, and is more significant when selection switches are relatively large compared to current source devices 100 and routing areas become a sizable portion of DAC area, as embodiments reduce cell counts compared to the design of FIG. 2 in both scenarios. Area reduction is effective when each row of the DAC 300 is indexed by greater or equal to three bits or the DAC 300 has a considerable number of offset cells 320. Reference biasing device 430, as illustrated in FIG. 4, may consume twice the current compared to device 440. However, this is typically negligible compared to the total DAC consumption. Each half cell 120 consumes the same amount of current as the unit cell 110 in DAC 200. In the DAC 300, the each unit cell 115 may receive twice the amount of current as the half cell 120. For example, each unit cell 115 may receive two micro amps, while each half cell 120 receives a single micro amp.

FIG. 4 illustrates a half cell 420 and a unit cell 410 with respective reference biasing devices 430 and 440 in accordance with embodiments described herein.

FIG. 4 illustrates the half cell 420 with a PMOS biasing cell 430. The half cell 420 includes PMOS transistors 422 and 424. The current passing PMOS transistors 422 and 424 may be represented, $$I_{2P} = \beta\left[(V_{gs} - V_{t0})V_{ds} - \frac{V_{ds}^2}{2}\right] = \frac{1}{2}\beta(V_{gs} - V_{ds} - V_{t0})^2 \quad (1)$$

$$\text{and } V_{ds} = \left(1 - \frac{\sqrt{2}}{2}\right)(V_{gs} - V_{t0})$$

where $\beta$ is proportional to W/L (width over length of the device). Eq. 1 ignores the channel length modulation which is negligible when cascode devices are in place. A subscript may be used to denote properties of certain devices, e.g. $V_{t1}$, $V_{t2}$, $V_{t3}$ are the thresholds of PMOS transistor used in the biasing device 435, half cell PMOS transistors 422 and 424. $V_{t12}$ is equal to $V_{t1}-V_{t2}$ and $V_{t0}$ means the ideal threshold without variation, which is the same for all devices in the figure. The same current could be obtained with threshold variation as, $$I_{2P} = \beta\left[(V_{gs} - V_{t3} - V_{t23})V_{ds} - \frac{V_{ds}^2}{2}\right] = \frac{1}{2}\beta(V_{gs} - V_{ds} - V_{t3})^2 \quad (2)$$

$$\text{and } V_{ds} \approx \left(1 - \frac{\sqrt{2}}{2} - \frac{1-\sqrt{2}}{2}\frac{V_{t23}}{V_{gs} - V_{th3}}\right)(V_{gs} - V_{t3})$$

Viewing the threshold variation of the transistor in biasing device 435 as the variation of transistor 424 equivalently, we have, $$\frac{I_{2P}}{I_{0P}} = \frac{\frac{1}{2}\beta(V_{gs} - V_{t1} - V_{t31})^2\left(\frac{\sqrt{2}}{2} + \frac{1-\sqrt{2}}{2}\frac{V_{t23}}{V_{gs} - V_{t3}}\right)^2}{\frac{1}{2}\beta(V_{gs} - V_{t1})^2} \approx \quad (3)$$

$$\frac{1}{2}\left[1 + \sqrt{2}(1-\sqrt{2})\frac{V_{t23}}{V_{gs} - V_{t3}} + \frac{4V_{t31}}{V_{gs} - V_{t1}}\right] \approx$$

$$\frac{1}{2}\left[1 + \sqrt{2}(1-\sqrt{2})\frac{V_{t23}}{V_{gs} - V_{t1}} + \frac{4V_{t31}}{V_{gs} - V_{t1}}\right]$$

The approximate equal has applied Taylor expansion. Following a similar approach, the current passing PMOS transistors 423 may be represented, $$\frac{I_{2T}}{I_{0T}} = \frac{\frac{1}{2}\beta(V_{ac} - V_{t4} - V_{t54})^2}{\frac{1}{2}\beta(V_{ac} - V_{t4})^2} \approx 1 + \frac{4V_{t54}}{V_{ac} - V_{t4}} \quad (4)$$

where $V_{t4}$, $V_{t54}$ are the threshold of device 445 and the threshold difference of device 423 over 445, respectively. Both equations (3) and (4) have suggested that the threshold mismatch is normalized by over-drive voltage, which is $$V_{gs} - V_{t1} \text{ or } V_{ac} - V_{t4} \propto \sqrt{\frac{IL}{W}}, \quad (5)$$

where I is the current passing through the half cell, W is the width and L is the length of the transistor. The above three are generic device parameters and are not representing specific device parameter values. On the other hand, standard deviation of the threshold variation has the following relationship to half cell sizes:

$$\sigma_1 \propto \frac{1}{\sqrt{WL}} \quad (6)$$

Combining (5) and (6), the standard deviation of the current has $$\sigma_1 \propto \frac{1}{L\sqrt{I}} \quad (7)$$

Because the unit cell 115 of FIG. 3 passes twice the current of the unit cell 110 in FIG. 2, from Eq. (7) the unit cell design of FIG. 2 must be $\sqrt{2}$ times in length to maintain the accuracy due to the current scaling, but could be $$\frac{1}{\sqrt{2}}$$

times in width to have the same over-drive voltage.

From Eq. (3) and (4), calculations of the standard deviations for the design of FIG. 3 and design of FIG. 2 are 4.04 $\sqrt{2}\sigma_{t0}$ and $4\sqrt{2}\sigma_{t0}$, respectively, where $\sigma_{t0}$ is the threshold standard deviation of the unit cell normalized by the same over drive voltage. There is barely any LSB accuracy degradation for the FIG. 3 design or it could be offset by slight area increase. Simulation in a 0.16 um process illustrates that the design of FIG. 3 has better LSB accuracy compared to a design of FIG. 2 with respect to device sizes and reference current selection.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

The invention claimed is:

1. A current digital to analog converter (DAC), comprising:
   an offset array including a plurality of unit cells of a first size; and
   a trimming array including a plurality of unit cells having the first size and a plurality of half cells, wherein the half cells have a larger size than the first size of plurality of unit cells.

2. The converter of claim 1, wherein a half cell handles substantially half of a current amount as a unit cell.

3. The converter of claim 1, wherein the offset array is configured to generate an offset current of the DAC converter.

4. The converter of claim 1, wherein the trimming array is configured to vary the current output depending on digital controls and/or to cancel manufacturing process variations of the DAC converter.

5. The converter of claim 1, wherein a row of the trimming array includes three unit cells and two half cells.

6. The converter of claim 1, wherein the offset array includes twenty-four unit cells.

7. The converter of claim 1, wherein the trimming array includes sixteen half cells and twenty-four unit cells.

8. The converter of claim 1, wherein a unit cell includes a current generation transistor, a row select transistor and a column select transistor.

9. The converter of claim 1, wherein a half cell includes two current generation transistors connected in series, a row select transistor and a column select transistor.

10. A method of performing digital to analog conversion (DAC) of a digital data stream, comprising:
  generating a plurality of first currents using respective unit cells having a first size in a trimming cell array;
  selecting at least one unit cell to decode a first bit of the received digital data stream;
  generating a plurality of second currents using respective half cells of the trimming cell array;
  selecting at least one half cell to decode a second bit of the received digital data stream; and
  providing an offset array including a plurality of unit cells having the first size;
  wherein the half cells have a larger size than the first size of the pluralities of unit cells.

11. The method of claim 10, wherein unit cells and half cells are selected using row and column selections.

12. The method of claim 10, wherein digital to analog conversion is performed by generating an offset current using the offset array.

13. The method of claim 10, wherein a half cell handles substantially half of a current amount as a unit cell.

14. The method of claim 10, wherein the trimming array is configured to vary the current output depending on digital controls or to cancel manufacturing process variations of the DAC converter.

15. The method of claim 10, wherein a row of the trimming array includes three unit cells and two half cells.

16. The method of claim 10, wherein a unit cell includes a current generation transistor, a row select transistor and a column select transistor.

17. The method of claim 10, wherein a half cell includes two current generation transistors connected in series, a row select transistor and a column select transistor.

18. The method of claim 10:
  wherein the second currents are less than the first currents.

* * * * *